United States Patent
Kutsukake et al.

(10) Patent No.: US 7,411,825 B2
(45) Date of Patent: Aug. 12, 2008

(54) SEMICONDUCTOR INTEGRATED CIRCUIT DEVICE

(75) Inventors: Hiroyuki Kutsukake, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 11/450,355

(22) Filed: Jun. 12, 2006

(65) Prior Publication Data

US 2007/0036000 A1    Feb. 15, 2007

(30) Foreign Application Priority Data

Jul. 27, 2005    (JP)    ............................. 2005-217513

(51) Int. Cl.
*G11C 16/04* (2006.01)
(52) U.S. Cl. ............................. 365/185.17; 365/185.05; 365/185.11
(58) Field of Classification Search ............ 365/185.17, 365/185.05, 185.11
See application file for complete search history.

(56) References Cited

U.S. PATENT DOCUMENTS

| | | | | |
|---|---|---|---|---|
| 5,936,887 | A | * | 8/1999 | Choi et al. ............ 365/185.17 |
| 6,859,394 | B2 | * | 2/2005 | Matsunaga et al. ...... 365/185.17 |
| 7,221,588 | B2 | * | 5/2007 | Fasoli et al. ............ 365/185.17 |
| 2005/0023597 | A1 | | 2/2005 | Kutsukake et al. |
| 2005/0073001 | A1 | | 4/2005 | Kamigaichi et al. |
| 2006/0146608 | A1 | * | 7/2006 | Fasoli et al. ............ 365/185.17 |
| 2007/0115723 | A1 | * | 5/2007 | Chen et al. ............ 365/185.17 |

FOREIGN PATENT DOCUMENTS

| | | |
|---|---|---|
| JP | 08-115987 | 5/1996 |
| JP | 2000-269468 | 9/2000 |
| JP | 2005-56989 | 3/2005 |
| JP | 2006-190820 | 7/2006 |

OTHER PUBLICATIONS

U.S. Appl. No. 11/450,355, filed Jun. 12, 2006, Kutsukake et al.
U.S. Appl. No. 11/550,636, filed Oct. 18, 2006, Arai et al.
U.S. Appl. No. 11/565,843, filed Dec. 1, 2006, Arai et al.
U.S. Appl. No 11/566,283, filed Dec. 4, 2006, Arai et al.
Tsuneyuki Miyake, "Process leading to 16-Gbit NAND Flash, Realization of Ultimate Cell of 4F2 with 50 nm by Toshiba", Nikkei Micro Devices, Aug. 2003, pp. 57-62 and 2 cover pages.

* cited by examiner

*Primary Examiner*—Richard T. Elms
*Assistant Examiner*—Eric Wendler
(74) *Attorney, Agent, or Firm*—Oblon, Spivak, McClelland, Maier & Neustadt, P.C.

(57) ABSTRACT

A semiconductor integrated circuit device includes first to third memory cell units, first and second bit lines, and first and second source lines. The first to third memory cell units include memory cell transistors serially connected between selection transistors. The first bit line is commonly connected to one end of the current path of the first memory cell unit and one end of the current path of the second memory cell unit. The second bit line is connected to one end of the current path of the third memory cell unit. The first source line is connected to the other end of the current path of the first memory cell unit. The second source line is commonly connected to the other end of the current path of the second memory cell unit and the other end of the current path of the third memory cell unit.

17 Claims, 9 Drawing Sheets

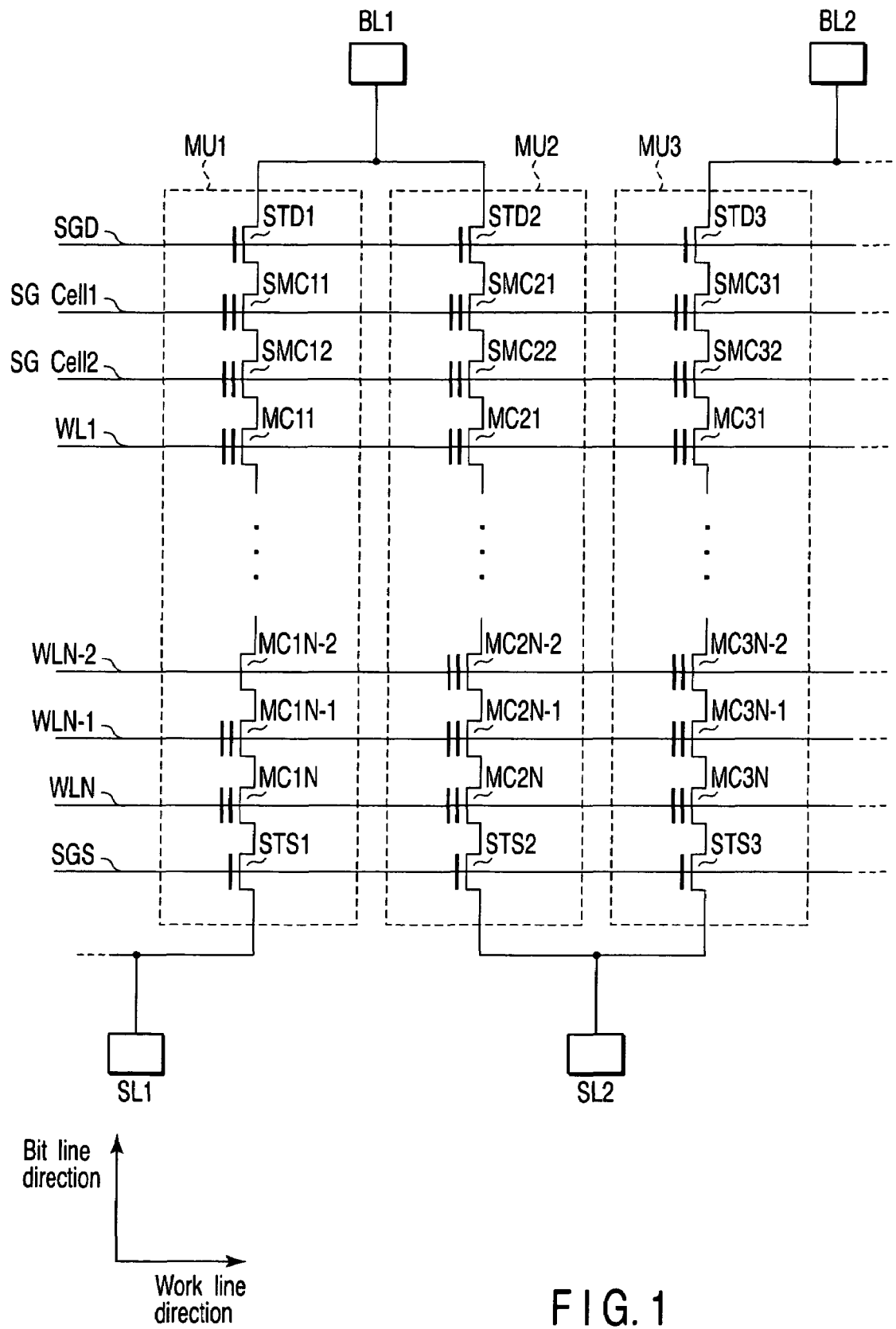
F I G. 1

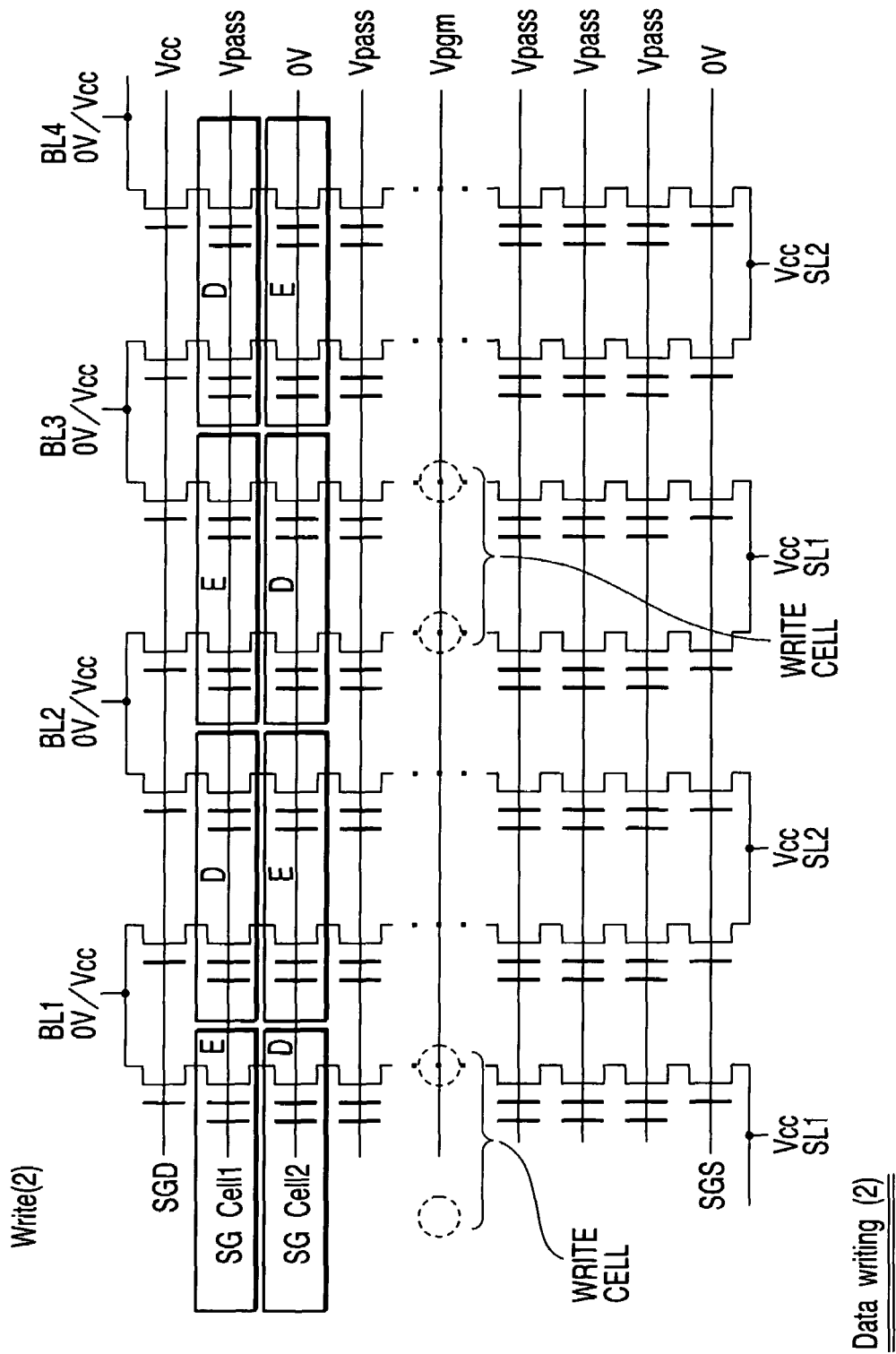
F I G. 8

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-217513, filed Jul. 27, 2005, the entire contents of which are incorporated herein by reference.

BACKGROUND OF THE INVENTION

1. Field of the Invention

This invention relates to a semiconductor integrated circuit device and more particularly to a semiconductor integrated circuit device having an electrically rewritable nonvolatile semiconductor memory device.

2. Description of the Related Art

A nonvolatile semiconductor memory device, particularly a NAND flash memory, is further miniaturized. Recently, a memory cell having an area of $2F \times 2F = 4F^2$, where the minimum processing size is F, has been developed (Reference Document: Tsuneyuki Miyake, "Process leading to 16-Gbit NAND Flash, Realization of Ultimate Cell of 4F2 with 50 nm by TOSHIBA" NIKKEI Micro Devices, August, 2003, pp 57 to 62).

In a memory cell array in which the memory cells described above are integrated, the arrangement pitch of the element regions is 2F. Therefore, the arrangement pitch of bit lines becomes 2F and the arrangement pitch of bit line contacts which connect the bit lines to the diffusion layers of block selection transistors is also set to 2F.

However, unlike the element region pattern or bit line pattern, the bit line contact pattern is not a line pattern, but a hole pattern. The resolution of the hole pattern is lower than that of the line pattern and an error caused at the etching time is larger. Therefore, when memory cells having bit line contacts arranged at the pitch 2F are formed, the arrangement becomes extremely tight from a technical viewpoint.

Therefore, memory cells having bit line contacts arranged at twice the above pitch are described in Jpn. Pat. Appln. KOKAI Publication No. 2005-56989. In this specification, memory cells used in this type of memory cell array are called double-pitch cells.

BRIEF SUMMARY OF THE INVENTION

A semiconductor integrated circuit device according to a first aspect of the present invention comprises first to third memory cell units having memory cell transistors serially connected between selection transistors, a first bit line commonly connected to one end of a current path of the first memory cell unit and one end of a current path of the second memory cell unit, a second bit line connected to one end of a current path of the third memory cell unit, a first source line connected to the other end of the current path of the first memory cell unit, and a second source line commonly connected to the other end of the current path of the second memory cell unit and the other end of the current path of the third memory cell unit.

A semiconductor integrated circuit device according to a second aspect of the present invention comprises a semiconductor substrate, element isolation regions which are arranged at a pitch P on the semiconductor substrate and separate first to third element regions in the semiconductor substrate, a first memory cell unit formed in the first element region and having memory cell transistors serially connected between selection transistors, a second memory cell unit formed in the second element region and having memory cell transistors serially connected between selection transistors, a third memory cell unit formed in the third element region and having memory cell transistors serially connected between selection transistors, a first bit line contact formed to extend over the first element region, element isolation region and second element region and commonly connected to one end of a current path of the first memory cell unit and one end of a current path of the second memory cell unit, a second bit line contact formed to extend over the third element region and element isolation region and connected to one end of a current path of the third memory cell unit, a first source line contact formed to extend over the element isolation region and first element region and connected to the other end of the current path of the first memory cell unit, and a second source line contact formed to extend over the second element region, element isolation region and third element region and commonly connected to the other end of the current path of the second memory cell unit and the other end of the current path of the third memory cell unit.

BRIEF DESCRIPTION OF THE SEVERAL VIEWS OF THE DRAWING

FIG. 1 is a circuit diagram showing one example of an equivalent circuit of a memory cell array provided in a semiconductor integrated circuit device according to one embodiment of this invention;

FIG. 8 is a diagram showing another example of the data writing operation with respect to the memory cell array provided in the semiconductor integrated circuit device according to one embodiment of this invention;

DETAILED DESCRIPTION OF THE INVENTION

In Jpn. Pat. Appln. KOKAI Publication No. 2005-56989, double-pitch cells are disclosed. In the double-pitch cells, the pitch of the bit line contacts can be increased to twice the normal pitch and the double-pitch cell can be easily formed in comparison with a typical memory cell. That is, it is suitable for miniaturization. The basic circuit configuration of a NAND flash memory utilizing double-pitch cells is described in Jpn. Pat. Appln. KOKAI Publication No. 2005-56989. However, a circuit configuration which is more suitable for practical use is not described.

There will now be described one embodiment of this invention with reference to the accompanying drawings. In this explanation, common reference symbols are attached to like portions throughout the drawings. In the embodiment, a NAND flash memory is shown as an example of a semiconductor integrated circuit device. However, this invention is not limited to a NAND flash memory and can be applied to a memory other than a NAND flash memory.

Figure 2:
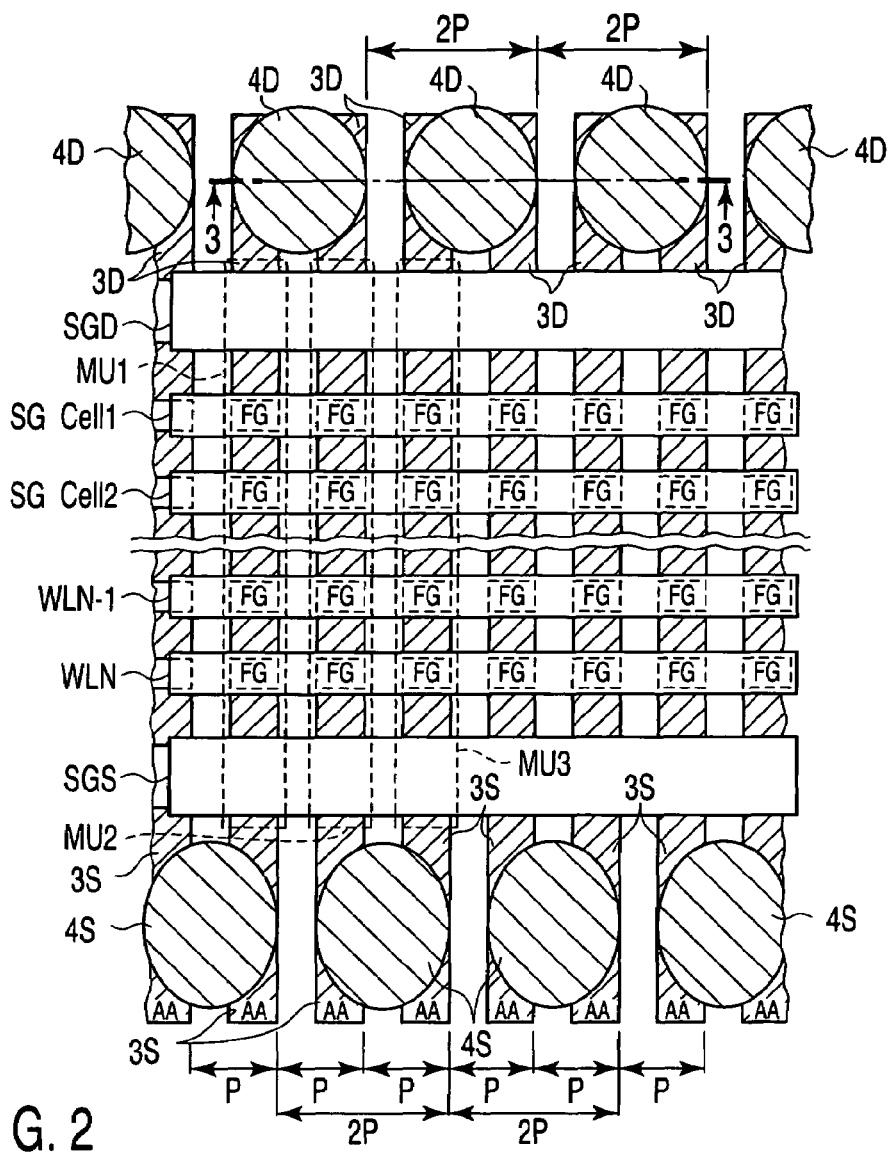
FIG. 2 is a plan view showing one example of the configuration of the memory cell array provided in the semiconductor integrated circuit device according to one embodiment of this invention.
Figure 3:
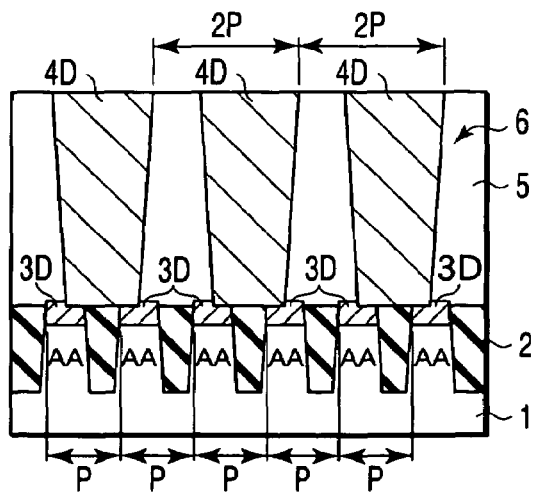
FIG. 3 is a cross-sectional view taken along the 3-3 line of FIG. 2.

FIG. 1 is a circuit diagram showing one example of an equivalent circuit of a memory cell array provided in the semiconductor integrated circuit device according to the present embodiment of this invention, FIG. 2 is a plan view showing one example of the configuration of the memory cell array provided in the semiconductor integrated circuit device according to one embodiment of this invention, and FIG. 3 is a cross-sectional view taken along the 3-3 line of FIG. 2.

As shown in FIGS. 1 to 3, element isolation regions 2 are formed on a semiconductor substrate, for example, a P-type silicon substrate (or P-type silicon well) 1. The element isolation regions 2 separate element regions AA in the surface of the substrate 1. One example of the element isolation regions 2 is shallow trench isolation (STI) regions. The element regions AA and element isolation regions 2 are arranged at pitch P on the substrate 1. One example of the pitch P is 2F. "F" is the minimum processing size. For example, both of the element regions AA and element isolation regions 2 are formed with the minimum processing size F.

In the element regions AA, memory cell units MU (MU1, MU2, MU3, . . . ) are arranged. The memory cell units MU in this example include memory cell transistors MC (MC11 to MC3N, . . . ) serially connected between block selection transistors STD (STD1, STD2, STD3, . . . ) and STS (STS1, STS2, STS3, . . . ).

In this example, bit lines BL (BL1, BL2, BL3, . . . ) are arranged one for every two element regions AA, for example.

The first bit line BL1 is commonly connected to one end of the current path of the first memory cell unit MU1 and one end of the current path of the second memory cell unit MU2 and the second bit line BL2 is connected to one end of the current path of the third memory cell unit MU3. The first memory cell unit MU1, second memory cell unit MU2 and third memory cell unit MU3 are arranged adjacent in a word line direction and commonly have word lines WL (WL1, WL2, . . . , WLN). In this example, one-side ends of the current paths of the first memory cell unit MU1 to the third memory cell unit MU3 are formed of N-type diffusion layers 3D. The N-type diffusion layers 3D are drains of the drain-side block selection transistors STD. In this example, the bit lines BL (BL1, BL2, BL3, . . . ) are connected to the N-type diffusion layers 3D via bit line contacts 4D. The bit line contacts 4D are arranged at a pitch 2P on the substrate 1. One example of the pitch P is 2F (F is the minimum processing size) as described above. The bit line contacts 4D of this example are conductive materials embedded in contact holes 6 formed in an inter-level insulating film 5. The inter-level insulating film 5 is formed on the substrate 1 having the element isolation regions 2. One example of the conductive material is tungsten. In this example, the bit lines BL (BL1, BL2, BL3, . . . ) are connected to the N-type diffusion layers 3D via the bit line contacts 4D, but this is not limitative. For example, the bit line BL can be directly connected to the N-type diffusion layer 4D via the contact hole 6 without using the bit line contact 4D.

In this example, two sets of source lines SL (SL1, SL2) are provided. The two sets of source lines SL1, SL2 can be used to supply different potentials to the memory cell units MU.

The first source line SL1 is connected to the other end of the current path of the first memory cell unit MU1, and the second source line SL2 is commonly connected to the other end of the current path of the second memory cell unit MU2 and the other end of the current path of the third memory cell unit MU3. In this example, the other ends of the current paths of the first to third memory cell units MU1 to MU3 are N-type diffusion layers 3S. The N-type diffusion layer 3S is the source of the source-side block selection transistor STS. In this example, the first and second source lines SL1, SL2 are connected to the N-type diffusion layers 3S via source line contacts 4S. Like the bit line contacts 4D, the source line contacts 4S are arranged at a pitch 2P on the substrate 1. On example of the pitch P is 2F (F is the minimum processing size) as described above. Like the bit line contacts 4D, the source line contact 4S of this example is a conductive material embedded in a contact hole 6 formed in the inter-level insulating film 5. One example of the conductive material is tungsten. In this example, the first and second source lines SL1, SL2 are connected to the N-type diffusion layers 3S via the source line contacts 4S, but this is not limitative. For example, the first and second source lines SL1, SL2 can be directly connected to the N-type diffusion layers 3S via the contact holes 6.

In this example, selection transistors are provided in addition to the block selection transistors STD, STS. Some of the memory cell transistors are used as the selection transistors. In this example, the memory cell transistors MC (STMC11, STMC21, STMC31, . . . ) of the memory cell units MU which are arranged adjacent to the drain-side block selection transistors among the memory cell transistors MC arranged in a matrix form and the memory cell transistors MC (STMC12, STMC22, STMC32, . . . ) which are arranged adjacent to the memory cell transistors MC (STMC11, STMC21, STMC31, . . . ) are used as the selection transistors.

Next, one example of the application method of the memory cell transistors as the selection transistors is explained.

Figure 4:
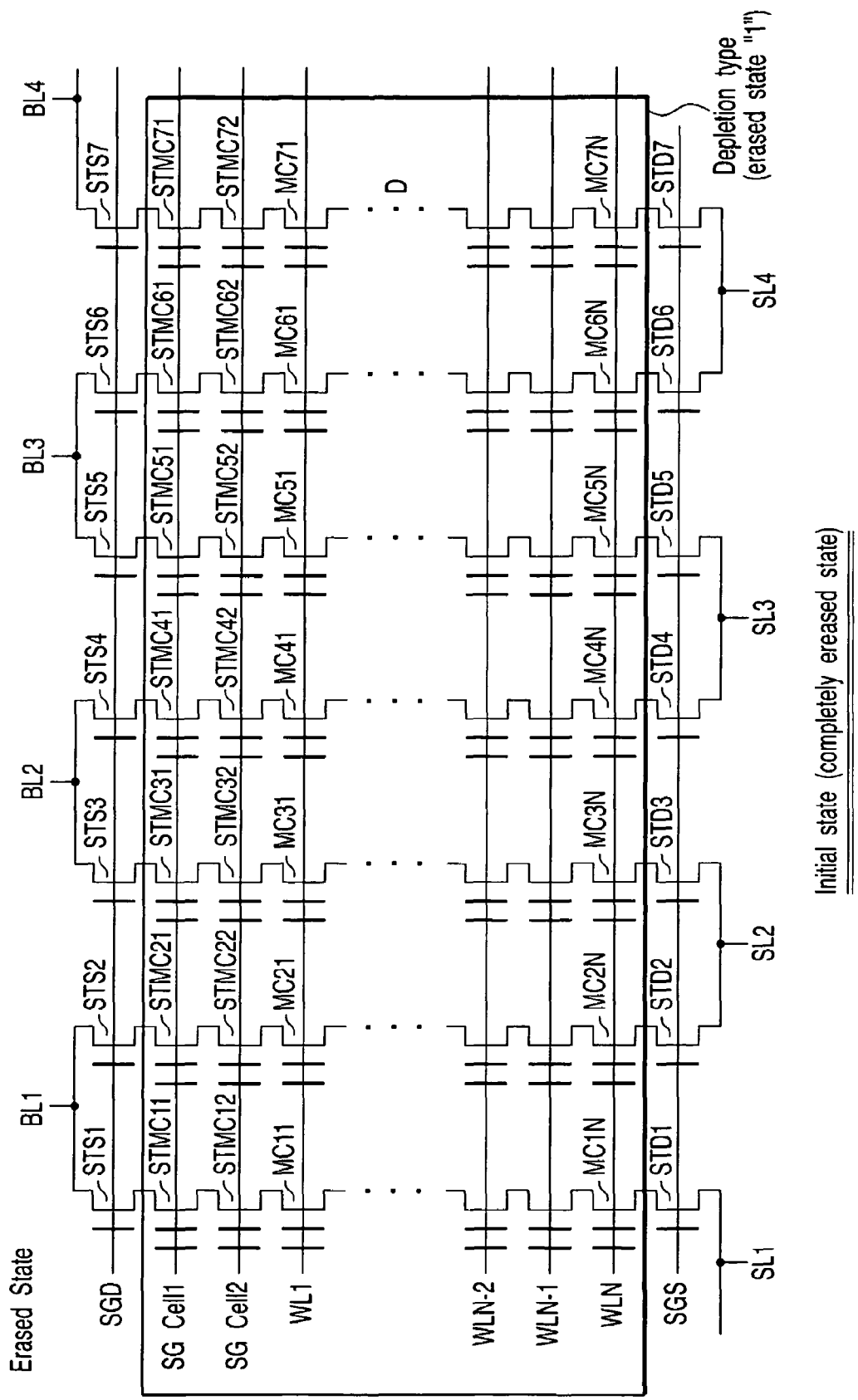
FIG. 4 is a diagram showing one example of the initial state of the memory cell array provided in the semiconductor integrated circuit device according to one embodiment of this invention.

FIG. 4 is a diagram showing one example of the initial state of the memory cell array provided in the semiconductor integrated circuit device according to one embodiment of this invention.

As shown in FIG. 4, all of the memory cell transistors MC are set in the erase state in the initial state. For example, the memory cell transistors MC set in the erase state are of a depletion type. The state is defined as data "1". If all of the memory cell transistors MC are set to data "1", the memory cell transistors STMC (STMC11, STMC21, STMC31, . . . , STMC12, STMC22, STMC32, . . . ) cannot be used as the selection transistors. Therefore, in this example, a spare data writing operation (a preliminary data writing operation) is performed for the memory cell transistors STMC (STMC11, STMC21, STMC31, . . . , STMC12, STMC22, STMC32, . . . ) after data erasing and before data writing.

Figure 5:
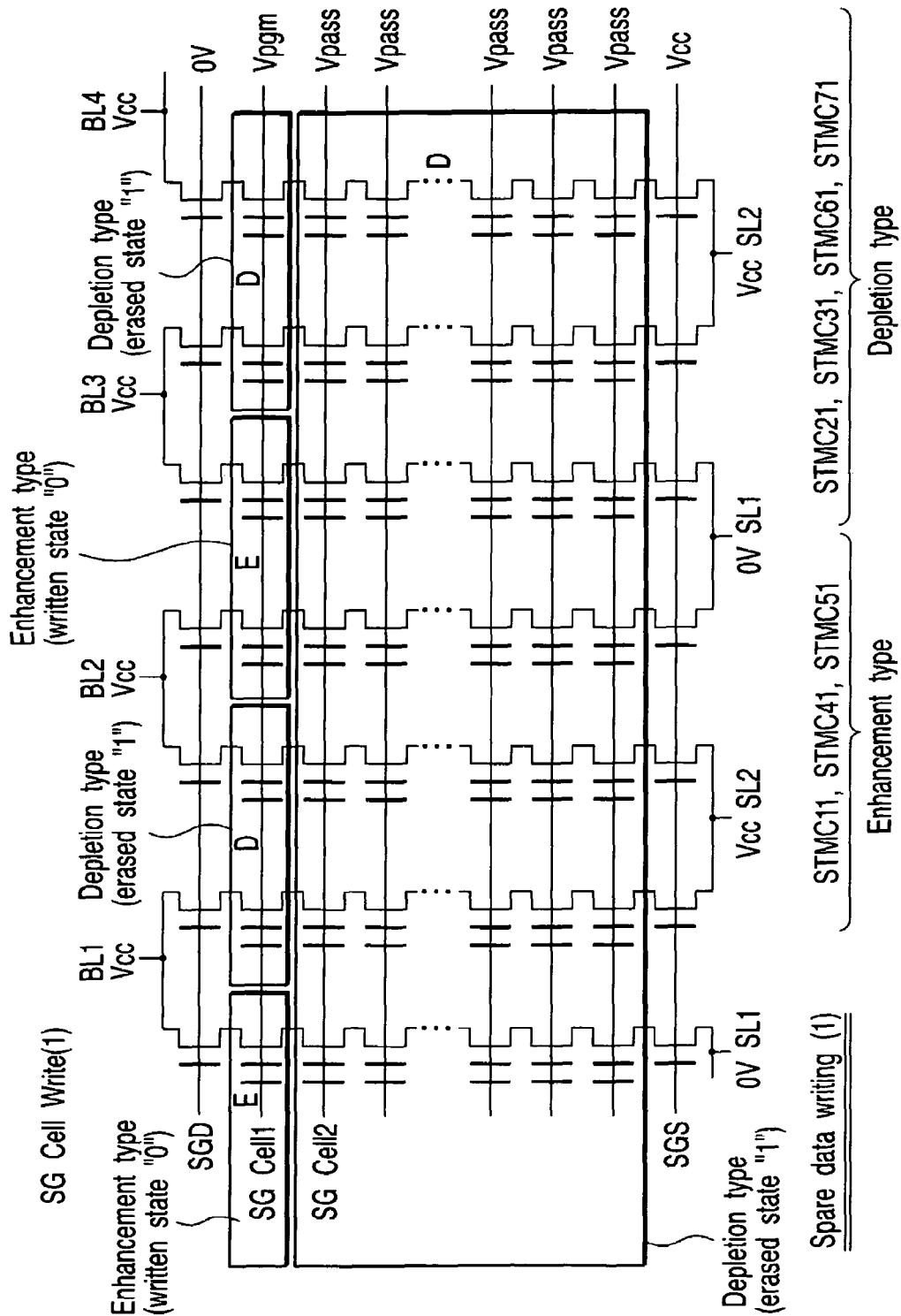
FIG. 5 is a diagram showing one example of the spare data writing operation with respect to the memory cell array provided in the semiconductor integrated circuit device according to one embodiment of this invention.
Figure 6:
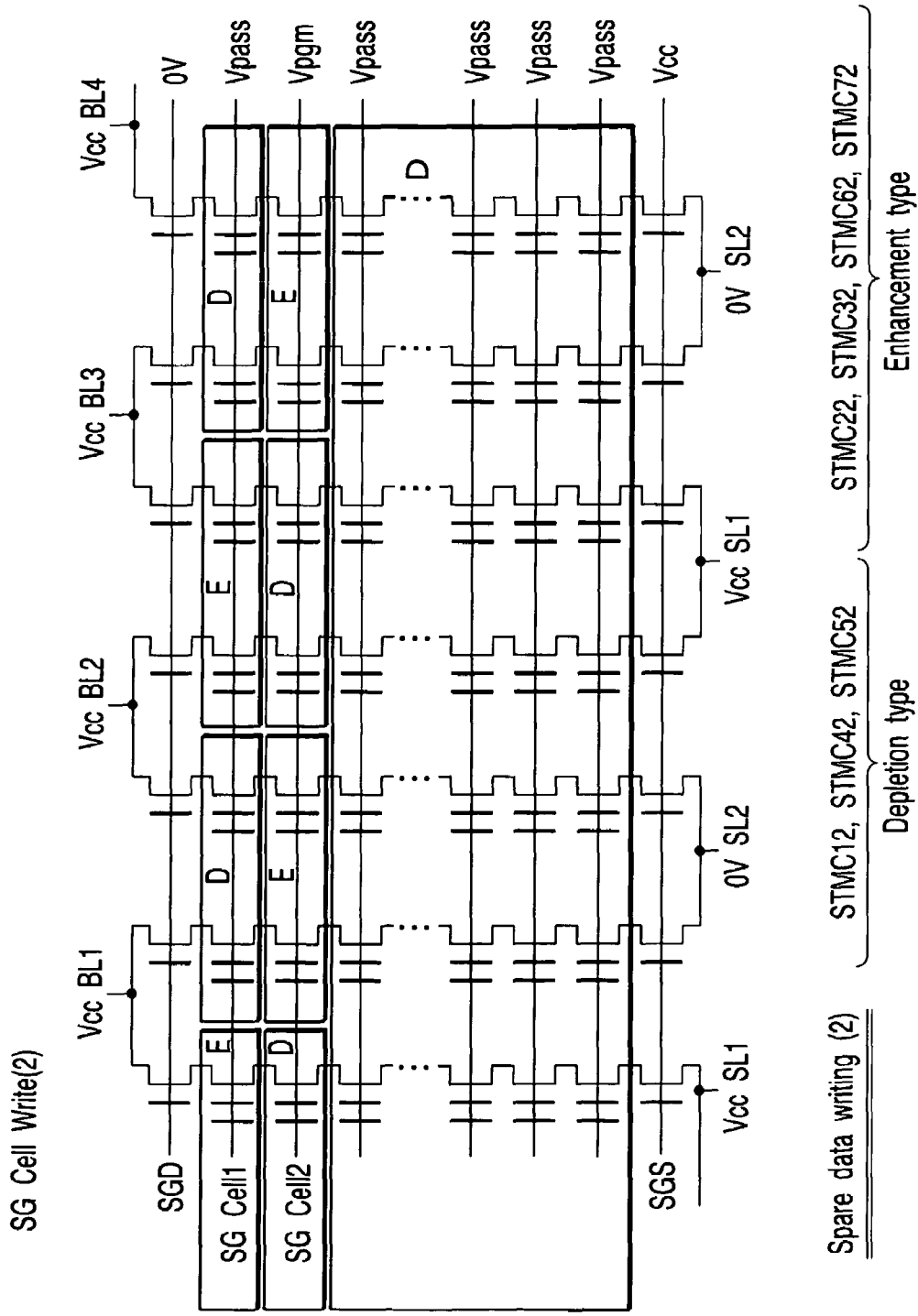
FIG. 6 is a diagram showing another example of the spare data writing operation with respect to the memory cell array provided in the semiconductor integrated circuit device according to one embodiment of this invention.

FIGS. 5 and 6 are diagrams each showing one example of the spare data writing operation with respect to the memory cell array provided in the semiconductor integrated circuit device according to one embodiment of this invention.

The spare data writing operation of this example is performed by use of the first and second source lines SL1, SL2 and data for spare data writing is input via the first and second source lines SL1, SL2.

<Spare Data Writing (1)>

First, the spare data writing operation is performed for the memory cell transistors STMC (STMC11, STMC21, STMC31, . . . ) having a first cell selection gate line SGCell1 as the gates.

As shown in FIG. 5, the potential of the drain-side block selection gate line SGD is set to 0V and the potential of the source-side block selection gate line SGS is set to Vcc. Thus, all of the drain-side block selection transistors STD (STD1, STD2, STD3, . . . ) are turned off and all of the source-side block selection transistors STS (STS1, STS2, STS3, . . . ) are turned on.

At this time, the potential of the bit lines BL (BL1, BL2, . . . ) is set to Vcc, for example.

Next, the potential of the first source line SL1 is set to 0V and the potential of the second source line SL2 is set to Vcc.

Then, the potential of the word lines WL (WL1 to WLN) and a second cell selection gate line SGCell2 are set to Vpass. Further, the potential of the first cell selection gate line SGCell1 is set to Vpgm higher than Vpass. Data corresponding to the potentials of the first and second source lines SL1, SL2 is written into the memory cell transistors STMC (STMC11, STMC21, STMC31, . . . ) having the first cell selection gate line SGCell1 as the gates.

In this example, data "0" is written into the memory cell transistors STMC (STMC11, STMC41, STMC51, . . . ) of the memory cell units MU which are connected to the first source lines SL1. The memory cell transistors STMC (STMC11, STMC41, STMC51, . . . ) are changed from the depletion type to the enhancement type, for example.

Further, the memory cell transistors STMC (STMC21, STMC31, STMC61, STMC71, . . . ) of the memory cell units MU which are connected to the second source lines SL2 maintain data "0". The memory cell transistors STMC (STMC21, STMC31, STMC61, STMC71, . . . ) are kept in the depletion type.

<Spare Data Writing (2)>

Next, the spare data writing operation is performed for the memory cell transistors STMC (STMC12, STMC22, STMC32, . . . ) having the second cell selection gate line SGCell2 as the gates.

As shown in FIG. 6, the potentials of the block selection gate lines SGD, SGS and bit lines BL (BL1, BL2, . . . ) are set the same as the potentials used in the case of <Spare Data writing (1)>.

Then, the potentials of the first and second source lines SL1 and SL2 are respectively set to Vcc and 0V in an inverted relation to the case of <Spare Data Writing (1)>.

Next, the potential of the word lines WL (WL1 to WLN) and the first cell selection gate line SGCell1 are set to Vpass. Further, the potential of the second cell selection gate line SGCell2 is set to Vpgm higher than Vpass. Data corresponding to the potentials of the first and second source lines SL1, SL2 is written into the memory cell transistors STMC (STMC12, STMC22, STMC32, . . . ) having the second cell selection gate line SGCell2 as the gates.

In this example, data "0" is written into the memory cell transistors STMC (STMC22, STMC32, STMC62, STMC72, . . . ) of the memory cell units MU which are connected to the second source lines SL2. The memory cell transistors STMC (STMC22, STMC32, STMC62, STMC72, . . . ) are changed from the depletion type to the enhancement type, for example.

Further, the memory cell transistors STMC (STMC12, STMC42, STMC52, . . . ) of the memory cell units MU which are connected to the first source lines SL1 maintain data "0". The memory cell transistors STMC (STMC12, STMC42, STMC52, . . . ) are kept in the depletion type.

Thus, the spare data writing operation is completed. After this, a data writing operation is performed, for example.

Figure 7:
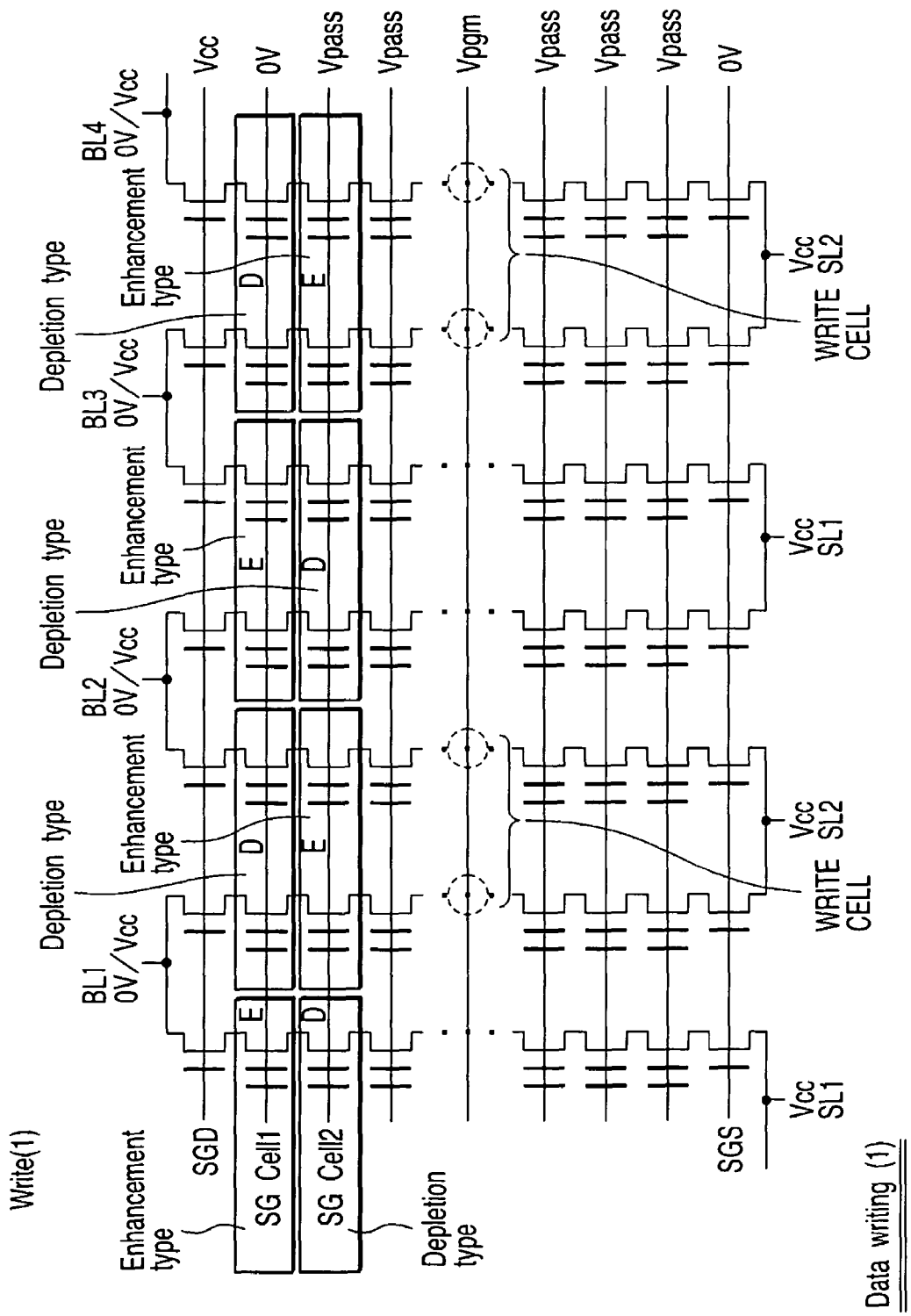
FIG. 7 is a diagram showing one example of the data writing operation with respect to the memory cell array provided in the semiconductor integrated circuit device according to one embodiment of this invention.

FIGS. 7 and 8 are diagrams each showing one example of the data writing operation with respect to the memory cell array provided in the semiconductor integrated circuit device according to one embodiment of this invention.

<Data Writing Operation (1)>

First, the data writing operation is performed for the memory cell units MU which are connected to the first or second source lines SL1 or SL2. In this example, the data writing operation is performed for the memory cell units MU which are connected to the second source lines SL2, but the order of the data writing operation is freely determined.

As shown in FIG. 7, the potential of the drain-side block selection gate line SGD is set to Vcc and the potential of the source-side block selection gate line SGS is set to 0V. All of the drain-side block selection transistors STD (STD1, STD2, STD3, . . . ) are turned on and all of the source-side block selection transistors STS (STS1, STS2, STS3, . . . ) are turned off.

At this time, the potentials of the bit lines BL (BL1, BL2, . . . ) are set to potentials corresponding to to-be-written data. For example, the potential of the bit lines is set to 0V or Vcc, respectively, when the to-be-written data is "0" or "1".

The potential of the first and second source lines SL1, SL2 is set to Vcc, for example.

Next, the potential of the non-selected word lines WL and the potential of the second cell selection gate line SGCell2 are set to Vpass. Further, the potential of the selected word line WL is set to Vpgm higher than Vpass and the potential of the first cell selection gate line SGCell1 is set to 0V. The enhancement type transistors among the memory cell transistors STMC (STMC11, STMC21, STMC31, . . . ) having the first cell selection gate line SGCell1 as the gates are turned off and the depletion type transistors thereof are turned on. The potential of the bit lines BL (BL1, BL2, . . . ) is transmitted to the memory cell unit MU containing the memory cell transistors STMC which are turned on. In this case, the potential is transmitted to the memory cell unit MU connected to the second source line SL2.

As a result, data "1" or "0" is written into the memory cell transistor MC contained in the memory cell unit MU connected to the second source line SL2 and having the selected word line WL as the gate according to the potential of the bit lines BL (BL1, BL2, . . . ).

<Data Writing Operation (2)>

Next, the data writing operation is performed for the memory cell unit MU connected to the first source line SL1.

As shown in FIG. 8, the potentials of the block selection gate lines SGD, SGS and first and second source lines SL1, SL2 are set the same as those used in the case of the <Data Writing Operation (1)>.

Like the case of the <Data Writing Operation (1)>, the potential of the bit lines BL (BL1, BL2, . . . ) is set to a potential corresponding to to-be-written data. For example, the potential of the bit lines BL is set to 0V or Vcc, respectively, when the to-be-written data is "0" or "1".

Next, the potential of the non-selected word lines WL and the potential of the first cell selection gate line SGCell1 are set to Vpass. Further, the potential of the selected word line WL is set to Vpgm higher than Vpass. Then, the potential of the second cell selection gate line SGCell2 is set to 0V. The enhancement type transistors among the memory cell transistors STMC (STMC12, STMC22, STMC32, . . . ) having the second cell selection gate line SGCell2 as the gates are turned off and the depletion type transistors thereof are turned on. Like the case of the <Data Writing Operation (1)>, the potential of the bit lines BL (BL1, BL2, . . . ) is transmitted to the memory cell unit MU containing the memory cell transistors STMC which are turned on. In this example, the potential is transmitted to the memory cell unit MU connected to the first source line SL1.

As a result, data "0" or "1" is written into the memory cell transistor MC contained in the memory cell unit MU connected to the first source line SL1 and having the selected word line WL as the gate according to the potential of the bit lines BL (BL1, BL2, . . . ).

Thus, the data writing operation is completed. After this, the data read operation is performed.

Figure 9:
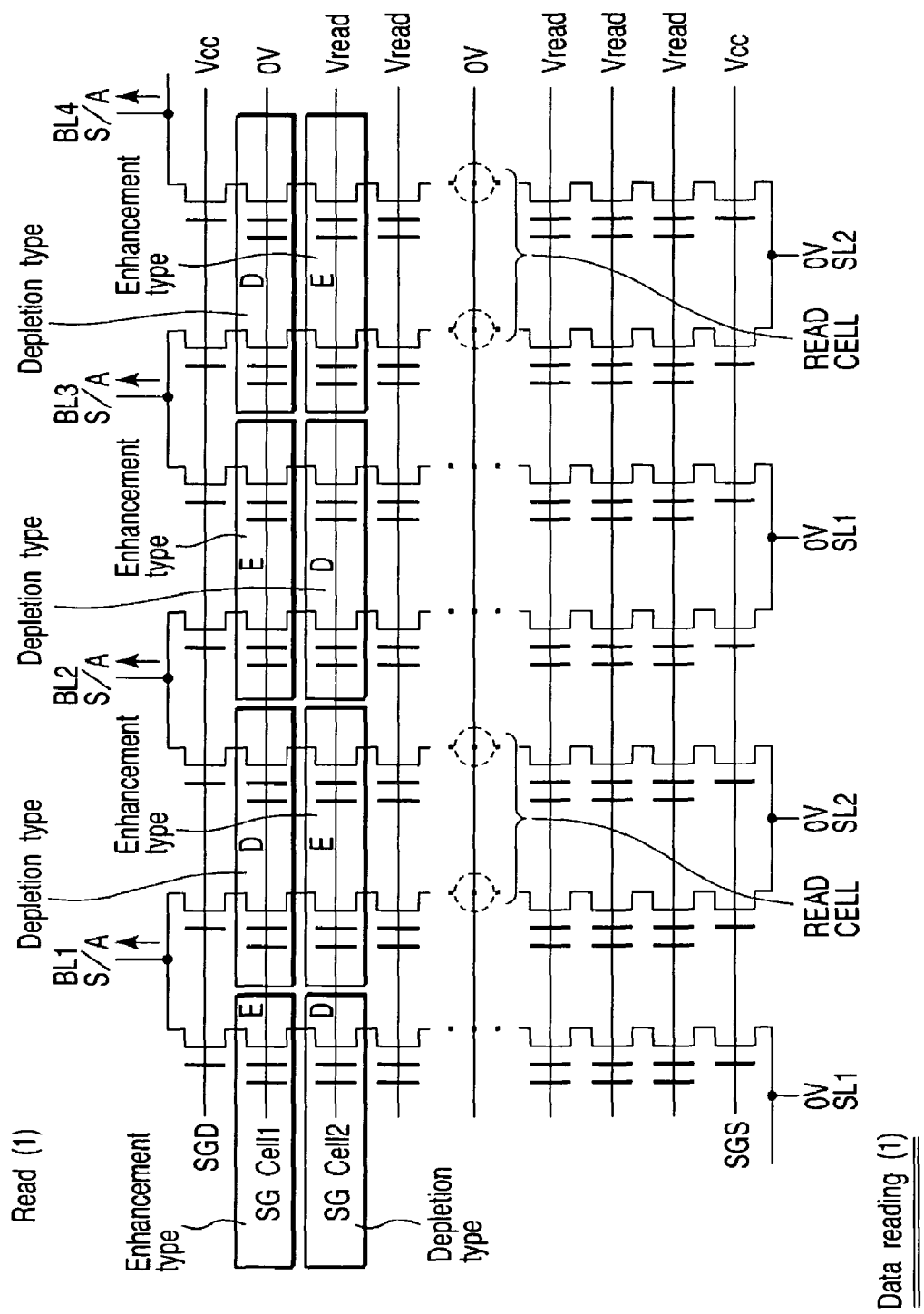
FIG. 9 is a diagram showing one example of the data read operation with respect to the memory cell array provided in the semiconductor integrated circuit device according to one embodiment of this invention.
Figure 10:
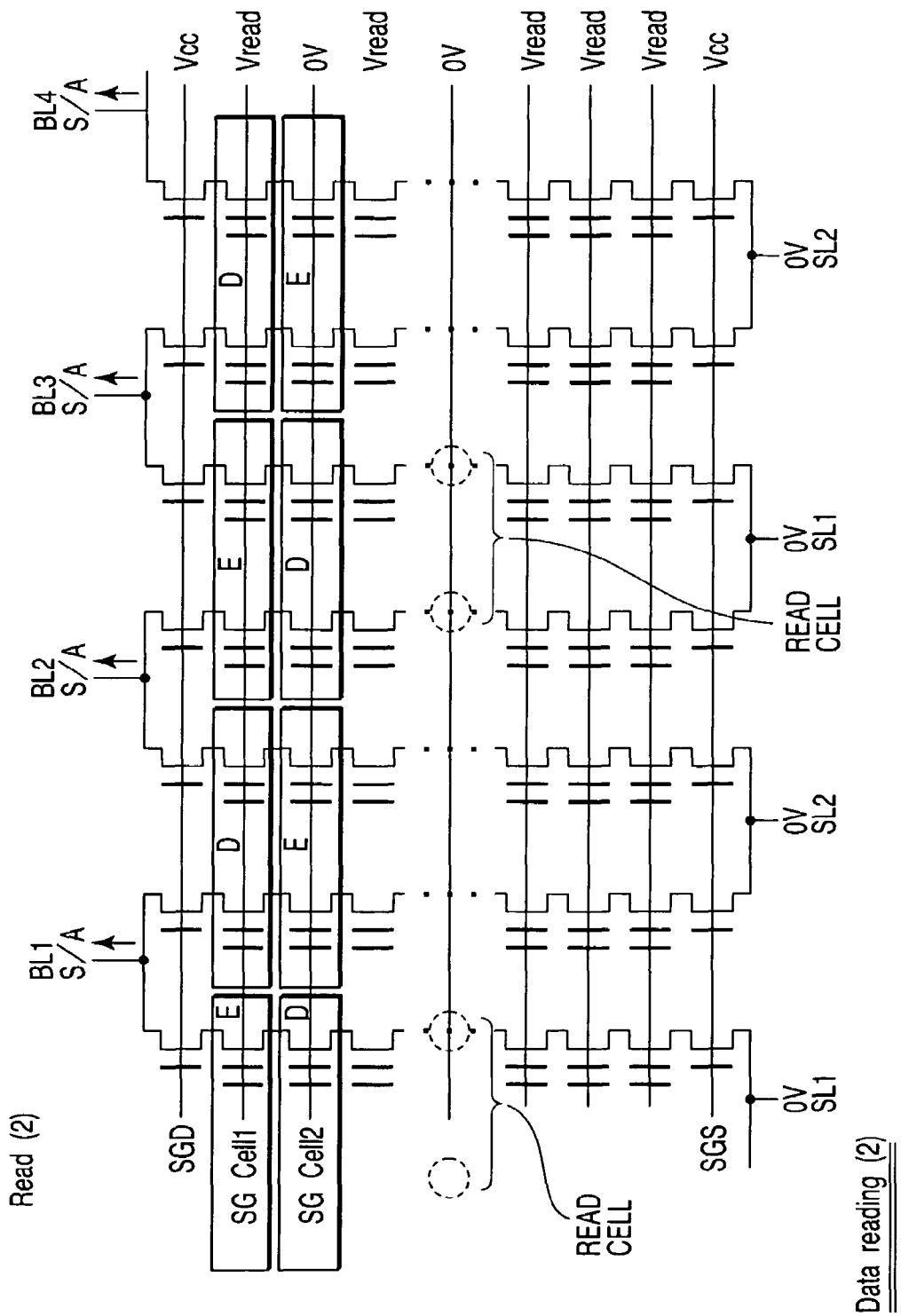
FIG. 10 is a diagram showing one example of the data read operation with respect to the memory cell array provided in the semiconductor integrated circuit device according to one embodiment of this invention.

FIGS. 9 and 10 are diagrams each showing one example of the data read operation with respect to the memory cell array provided in the semiconductor integrated circuit device according to one embodiment of this invention.

<Data Read Operation (1)>

First, the data read operation is performed for the memory cell units MU connected to the first or second source lines SL1 or SL2. In this example, the data read operation is performed for the memory cell units MU connected to the second source lines SL2, but the order of the data read operation is freely determined.

First, the potential of the bit lines BL (BL1, BL2, . . . ) is set to precharge potential and the potentials of the first and second source lines SL1, SL2 are set to 0V.

After this, as shown in FIG. 9, the potential of the non-selected word lines WL and the potential of the second cell selection gate line SGCell2 are set to Vread. Further, the potential of the selected word line WL is set to 0V. Further, the potential of the first cell selection gate line SGCell1 is set to 0V. The enhancement type transistors among the memory cell transistors STMC (STMC11, STMC21, STMC31, . . . ) having the first cell selection gate line SGCell1 as the gates are turned off and the depletion type transistors thereof are turned on. In this example, the memory cell transistors STMC (STMC21, STMC31, STMC61, STMC71 . . . ) contained in the memory cell units MU connected to the second source lines SL2 are turned on.

Further, both of the potential of the drain-side block selection gate line SGD and the potential of the source-side block selection gate line SGS are set to Vcc. All of the drain-side block selection transistors STD (STD1, STD2, STD3, . . . ) and source-side block selection transistors STS (STS1, STS2, STS3, . . . ) are turned on.

As a result, the potential of the bit lines BL (BL1, BL2, . . . ) is maintained or changed according to as whether data "0" or "1" is stored in the memory cell transistor MC contained in the memory cell unit MU connected to the second source line SL2 and having the selected word line WL as the gate. For example, when the memory cell transistor MC stores data "0", the memory cell transistor MC functions as the enhancement type transistor in this example and is therefore turned off. Thus, the potential of the bit line BL maintains the precharge potential. On the other hand, when the memory cell transistor MC stores data "1", the memory cell transistor MC functions as the depletion type transistor in this example and is therefore turned on. Thus, the potential of the bit line BL is lowered from the precharge potential. By reading the potential of the bit lines BL (BL1, BL2, . . . ) by use of a sense amplifier (S/A), it is determined that read data is "0" or "1".

<Data Read Operation (2)>

Next, the data read operation is performed with respect to the memory cell units MU connected to the first source lines SL1.

First, the potential of the bit lines BL (BL1, BL2, . . . ) is set to precharge potential and the potential of the first and second source lines SL1, SL2 is set to 0V. The above operation is the same as that of the <Data Read Operation (1)>.

After this, as shown in FIG. 10, the potential of the non-selected word lines WL and the potential of the first cell selection gate line SGCell1 are set to Vread. Further, the potential of the selected word line WL is set to 0V.

Further, the potential of the second cell selection gate line SGCell2 is set to 0V. The enhancement type transistors among the memory cell transistors STMC (STMC12, STMC22, STMC32, . . . ) having the second cell selection gate line SGCell2 as the gates are turned off and the depletion type transistors thereof are turned on. In this example, the memory cell transistors STMC (STMC12, STMC42, STMC52, . . . ) contained in the memory cell units MU connected to the first source lines SL1 are turned on.

Further, like the case of the <Data Read Operation (1)>, both of the potential of the drain-side block selection gate line SGD and the potential of the source-side block selection gate line SGS are set to Vcc.

As a result, like the case of the <Data Read Operation (1)>, the potential of the bit lines BL (BL1, BL2, . . . ) is maintained or changed according to as whether data "0" or "1" is stored in the memory cell transistor MC contained in the memory cell unit MU connected to the first source line SL1 and having the selected word line WL as the gate. By reading the potential of the bit lines BL (BL1, BL2, . . . ) by use of the sense amplifier (S/A), it is determined that read data is "0" or "1" like the case of the <Data Read Operation (1)>.

Thus, the data read operation is completed.

According to the above embodiment, a semiconductor integrated circuit device which has the NAND flash memory including double-pitch cells and having a circuit configuration which is suitable for the practical use can be attained.

For example, in the double-pitch cell described in Jpn. Pat. Appln. KOKAI Publication No. 2005-56989, the memory cell transistors MC are not used as selection transistors as explained in the present embodiment. Therefore, it is necessary for the block selection transistor to have a role of determining which one of the memory cell units adjacent in the word line direction is to be connected to the bit line. Simply, two drain-side selection gate lines SGD are necessary and one of the memory cell units which is to be connected to the bit line is determined by setting one of the two gate lines to a high level.

On the other hand, in the present embodiment, since the memory cell transistor MC is used as the selection transistor, it is sufficient to use one drain-side selection gate line SGD.

Further, as described in Jpn. Pat. Appln. KOKAI Publication No. 2005-56989, if two drain-side selection gate lines SGD are necessary, it is required to serially connect two drain-side selection transistors in processing the memory cell array. Further, the series-connected drain-side selection transistors of the enhancement type and depletion type must be alternately arranged. In order to form the drain-side selection transistor as the depletion type transistor, it is necessary to separately perform the channel ion-implantation process. Therefore, the number of manufacturing steps is increased. In addition, since the channel ion-implantation process utilizes the photolithography technique, the alignment margin is required. That is, it is difficult to miniaturize the semiconductor integrated circuit device.

On the other hand, in the present embodiment, the memory cell transistor MC (STMC) is used as the selection transistor. Therefore, the transistor can be selectively set to the depletion type transistor or enhancement type transistor by data writing.

Thus, the number of manufacturing steps is not increased as in Jpn. Pat. Appln. KOKAI Publication No. 2005-56989. In addition, since the alignment margin is not necessary, it is effective in miniaturizing the semiconductor integrated circuit device.

Further, according to the present embodiment, not only the bit line contacts 4D but also the source line contacts 4S can be formed with the pitch which is twice that of the element isolation regions 2 and element regions AA. That is, like the bit line contacts 4D, the source line contacts 4S can be easily processed and is suitable for miniaturization.

In this example, two sets of source lines of the first source lines SL1 and second source lines SL2 are provided. The first and second source lines SL1 and SL2 are connected to the sources of two memory cell units commonly using the bit line BL. In order to write data into the memory cell transistor MC (STMC) used as the selection transistor, for example, the potentials of the first and second source lines SL1, SL2 may be used. At the data writing time, if the potentials of the first and second source lines SL1, SL2 are made different, different data can be written into two memory cell transistors (for example, STMC11 and STMC21 or STMC12 and STMC22) used as the selection transistors by one data writing process. Therefore, according to the present embodiment, the data writing operation with respect to the memory cell transistors used as the selection transistors can be performed rapidly.

Thus, according to the present embodiment, a semiconductor integrated circuit device which has a nonvolatile semiconductor memory device including double-pitch cells and having a circuit configuration which is suitable for practical use can be attained.

This invention has been explained by taking one embodiment as an example, but the present embodiment of this invention is not the only embodiment. Further, when the embodiment is put into practice, this invention can be variously modified without departing from the technical scope thereof.

In the above embodiment, for example, the potential of the non-selected word line is set at Vpass during the spare data writing operation and the data writing operation. The present embodiment is not necessarily limited to this. The potential of the non-selected word line can arbitrarily according to a data write method.

The above embodiment contains inventions of various stages and the inventions of various stages can be extracted by adequately combining a plurality of constituents disclosed in the present embodiment.

Further, the above embodiment is explained based on the example in which this invention is applied to a NAND flash memory. However, this invention is not limited to a NAND flash memory and can be applied to a flash memory other than a NAND flash memory. In addition, a semiconductor integrated circuit device containing the flash memory, for example, a processor or system LSI is also contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   first to third memory cell units having memory cell transistors serially connected between selection transistors,
   a first bit line commonly connected to one end of a current path of the first memory cell unit and one end of a current path of the second memory cell unit,
   a second bit line connected to one end of a current path of the third memory cell unit,
   a first source line connected to the other end of the current path of the first memory cell unit, and
   a second source line commonly connected to the other end of the current path of the second memory cell unit and the other end of the current path of the third memory cell unit.

2. The device according to claim 1, wherein first to third memory cell transistors adjacent to one-side selection transistors of the first to third memory cell units and fourth to sixth memory cell transistors adjacent to the first to third memory cell transistors are used as selection transistors.

3. The device according to claim 2, wherein the first memory cell transistor is an enhancement type transistor, the second and third memory cell transistors are depletion type transistors, the fourth memory cell transistor is a depletion type transistor, and the fifth and sixth memory cell transistors are enhancement type transistors.

4. The device according to claim 2, wherein a spare data writing operation is performed for the first to sixth memory cell transistors after data erasing and before data writing.

5. The device according to claim 3, wherein a spare data writing operation is performed for the first sixth memory cell transistors after data erasing and before data writing.

6. The device according to claim 4, wherein data in the spare data writing operation is input via the first and second source lines.

7. The device according to claim 5, wherein data in the spare data writing operation is input via the first and second source lines.

8. A semiconductor integrated circuit device comprising:
   a semiconductor substrate,
   element isolation regions which are arranged at a pitch P on the semiconductor substrate and separate first to third element regions in the semiconductor substrate,
   a first memory cell unit formed in the first element region and having memory cell transistors serially connected between selection transistors,
   a second memory cell unit formed in the second element region and having memory cell transistors serially connected between selection transistors,
   a third memory cell unit formed in the third element region and having memory cell transistors serially connected between selection transistors,
   a first bit line contact formed to extend over the first element region, element isolation region and second element region and commonly connected to one end of a current path of the first memory cell unit and one end of a current path of the second memory cell unit,
   a second bit line contact formed to extend over the third element region and element isolation region and connected to one end of a current path of the third memory cell unit,
   a first source line contact formed to extend over the element isolation region and first element region and connected to the other end of the current path of the first memory cell unit, and
   a second source line contact formed to extend over the second element region, element isolation region and third element region and commonly connected to the other end of the current path of the second memory cell unit and the other end of the current path of the third memory cell unit.

9. The device according to claim 8, wherein first to third memory cell transistors of the first to third memory cell units which are arranged adjacent to selection transistors on the first to third bit line contacts side and fourth to sixth memory cell transistors adjacent to the first to third memory cell transistors are used as selection transistors.

10. The device according to claim 8, wherein the first and second bit line contacts are arranged at a pitch 2P.

11. The device according to claim 8, wherein the first and second source line contacts are arranged at a pitch 2P.

12. The device according to claim 9, wherein the first and second bit line contacts are arranged at a pitch 2P.

13. The device according to claim 9, wherein the first and second source line contacts are arranged at a pitch 2P.

14. The device according to claim 10, further comprising a first bit line connected to the first bit line contact and a second bit line connected to the second bit line contact,
wherein the first and second bit lines are arranged at a pitch 2P above the element isolation regions.

15. The device according to claim 12, further comprising a first bit line connected to the first bit line contact and a second bit line connected to the second bit line contact,
wherein the first and second bit lines are arranged at a pitch 2P above the element isolation regions.

16. The device according to claim 11, further comprising a first source line connected to the first source line contact and a second source line connected to the second source line contact,
wherein the first and second source lines are selectively used to supply different potentials.

17. The device according to claim 13, further comprising a first source line connected to the first source line contact and a second source line connected to the second source line contact,
wherein the first and second source lines are selectively used to supply different potentials.

* * * * *